(12) United States Patent
Lam

(10) Patent No.: US 6,352,895 B1
(45) Date of Patent: Mar. 5, 2002

(54) METHOD OF FORMING MERGED SELF-ALIGNED SOURCE AND ONO CAPACITOR FOR SPLIT GATE NON-VOLATILE MEMORY

(75) Inventor: Chung Hon Lam, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/525,973

(22) Filed: Mar. 15, 2000

(51) Int. Cl.⁷ .......................................... H01L 21/8247
(52) U.S. Cl. ...................................... 438/253; 438/257
(58) Field of Search ................................. 438/253, 257, 438/FOR 189, FOR 203, FOR 430; 148/DIG. 14

(56) References Cited

U.S. PATENT DOCUMENTS

| | | | |
|---|---|---|---|
| 4,861,730 A | | 8/1989 | Hsia et al. |
| 5,223,448 A | * | 6/1993 | Su |
| 5,274,588 A | | 12/1993 | Manzur et al. |
| 5,408,115 A | | 4/1995 | Chang |
| 5,414,287 A | | 5/1995 | Hong |
| 5,467,308 A | | 11/1995 | Chang et al. |
| 5,482,879 A | | 1/1996 | Hong |
| 5,578,516 A | * | 11/1996 | Chou |
| 5,595,928 A | * | 1/1997 | Lu et al. |
| 5,723,374 A | * | 3/1998 | Huang et al. |
| 5,811,853 A | | 9/1998 | Wang |
| 5,841,700 A | | 11/1998 | Chang |
| 5,851,881 A | | 12/1998 | Lin et al. |
| 5,877,525 A | | 3/1999 | Ahn |
| 5,888,863 A | * | 3/1999 | Tseng |
| 6,083,970 A | * | 7/2000 | Lin et al. |
| 6,225,160 B1 | * | 7/2001 | Huang |
| 6,291,293 B1 | * | 9/2001 | Miyai et al. |

* cited by examiner

*Primary Examiner*—George Fourson
(74) *Attorney, Agent, or Firm*—Scully, Scott, Murphy & Presser; William D. Sabo

(57) ABSTRACT

A non-volatile memory cell having a oxide-nitride-oxide (ONO) capacitor merged with a polysilicon strap diffusion region is obtained by forming a film stack on a surface of a substrate, said film stack comprising at least a floating gate oxide layer, a floating gate polysilicon later, an oxide layer and a nitride layer; forming an opening in said film stack so as to expose a portion of said floating gate polysilicon layer; forming oxide spacers in said opening; forming an oxide-nitride-oxide capacitor in said opening; forming polysilicon spacers on said oxide-nitride-oxide capacitor; providing a contact hole in said opening so as to expose a portion of said substrate; forming an oxide liner on exposed sidewalls of said contact hole; forming a source region in said substrate; forming oxide spacers from said oxide liner, wherein during the forming a portion of said substrate is re-expose; filling said opening and contact hole with doped polysilicon; and planarizing down to said nitride layer of said film stack.

20 Claims, 3 Drawing Sheets

METHOD OF FORMING MERGED SELF-ALIGNED SOURCE AND ONO CAPACITOR FOR SPLIT GATE NON-VOLATILE MEMORY

FIELD OF THE INVENTION

The present invention relates to a non-volatile memory cell and in particular to a method of forming a non-volatile memory cell by integrating an oxide-nitride-oxide (ONO) capacitor merged with a polysilicon strap to a diffusion region to enhance coupling of the source to the floating gate. The present invention also provides a novel non-volatile memory cell which includes, among other elements, an ONO capacitor merged with a polysilicon strap to a diffusion region, whereby enhanced coupling of the source to the floating gate is obtained.

BACKGROUND OF THE INVENTION

As is known to one skilled in the art, non-volatile memory cells are types of memory devices that are capable of retaining stored information after the power supply has been removed. Memory cells of this type include: erasable programmable read only memory (EPROM) and electrically erasable programmable read only memory (EEPROM). In EEPROM memory cells, programming or writing is achieved by injection of hot electrons from the substrate through an oxide layer in response to a high applied drain voltage. Erasure, on the other hand, is achieved by photoemission of hot electrons from the floating gate to the control gate and the substrate.

EEPROMs generally employ two element cells with two transistors. Programming and erasing are achieved by means of the Fowler-Nordheim effect which employs electrons that tunnel through the energy barrier at the silicon-silicon oxide interface and into the oxide conduction band. During "reading" of the memory cell, the state of the EEPROM cell is determined by current sensing.

In conventional non-volatile spilt-gate memory cells, a self-aligned source/drain implant is employed in order to reduce the cell size below 30 $\mu m^2$. In such cells, programming is achieved by channel injection of hot electrons, while erasing is achieved by the Fowler-Nordheim tunneling or photommission from the floating gate.

Conventional split gate memory cells made from prior art processes include a floating gate that is charged by injection of hot electrons from the channel region of the transistor. A control gate is formed over the floating gate to control the portion of the channel region between the floating gate and the source region in order to achieve split gate operation.

Moreover, in split gate memory devices, the floating gate is made to overlap the drain region of the device so that writing and programming may be implemented. When there is no overlap, or an actual underlap, writing cannot be effectuated with hot electron injections; thereby reducing the programming efficiency of the memory device. Additionally, in split gate memory devices, the control gate must overlap the floating gate and extend over the channel to overlap the source region so as to enable turning "on" and driving the memory cell. In conventional split gate progressing, the source/drain regions are typically formed, i.e., implanted and activated, prior to poly gate formation. Such prior art processes, do not employ a fully self-aligned source/drain region; therefore the cell area size is extended and the transistor channel length increased.

In prior art split gate memory cells, any misalignment of the source relative to the floating gate affects the read current uniformity. In order to avoid misalignment, prior art non-volatile memory devices contain an overlap of the control gate to the source. Also, in some non-volatile memory devices, the drain is self-aligned to the floating gate, but the source region is not self-aligned to the floating gate; therefore, the channel length is not determinate. This, in turn, adversely affects current dispersion in the memory device during operation.

In cases wherein the total channel length is not a fixed distance, programming will also be adversely affected. If the total channel length varies, it is difficult to scale the dimensions of the layers used in forming the memory cell, thus high programming efficiency and cell reproducibility cannot be obtained. If, on the other hand, the length dimension is too large, the programming efficiency is not adequate, and the cell read current is reduced to the detriment of device operation. Additionally, when an overlap is provided, a substantial area of the cell is wasted and cell size becomes unnecessarily large.

In view of the drawbacks with prior art non-volatile memory devices, there is a continued need for developing a new and improved method of manufacturing a split gate non-volatile memory cell which can be scaled down to very-small geometries, while maintaining sufficient overlap between the floating gate and the source region as well as maintaining a functioning floating gate channel.

SUMMARY OF THE INVENTION

One object of the present invention is to provide a method of fabricating a floating gate non-volatile memory cell which has a geometry of about 0.5 $\mu m$ or less associated therewith.

Another object of the present invention is to provide a method of fabricating a non-volatile memory cell which has a sufficient overlapping region between the floating gate and the source diffusion, while maintaining a functional floating gate channel.

A further object of the present invention is to provide a method of fabricating a non-volatile memory cell which comprises a merged ONO capacitor and a polysilicon strap integrated to a diffusion region.

The above objects and advantages are achieved in the present invention by utilizing polysilicon spacers to define the source edge of the floating gate in a nitride trench defined over the floating gate polysilicon on an oxidized semiconductor substrate. More specifically, the above objects and advantages are achieved by integrating a merged ONO capacitor and a polysilicon strap to a diffusion region of the device. By integrating these elements, enhanced coupling of the source to the floating gate is obtained.

The inventive method comprises the steps of:
(a) forming a film stack on a surface of a substrate, said film stack comprising at least a floating gate oxide layer, a floating gate polysilicon layer, an oxide layer and a nitride layer;
(b) forming an opening in said film stack so as to expose a portion of said floating gate polysilicon layer;
(c) forming oxide spacers in said opening;
(d) forming an oxide-nitride-oxide capacitor in said opening;
(e) forming polysilicon spacers on said oxide-nitride-oxide capacitor;
(f) providing a contact hole in said opening so as to expose a portion of said substrate;
(g) forming an oxide liner in said contact hole and on said nitride layer of said film stack;

(h) forming a source region in said substrate;

(i) forming oxide spacers from said oxide liner;

(j) filling said opening and contact hole with doped polysilicon; and (k) planarizing down to said nitride layer of said film stack.

The non-volatile memory device is the completed by using conventional processing techniques which may include:

(l) removing the nitride layer and said floating gate polysilicon layer of said film stack;

(m) forming a wordline gate oxide; and (n) forming a wordline spacer about said wordline gate oxide.

The above method results in a non-volatile memory cell which comprises a substrate; and a source region formed in said substrate, said source region being self-aligned with an overlaying floating gate region, said floating gate region comprising an ONO capacitor merged with a polysilicon strap, and wherein said ONO capacitor and said polysilicon strap are integrated to said source region within the structure.

DETAILED DESCRIPTION OF THE INVENTION

Figure 1A:
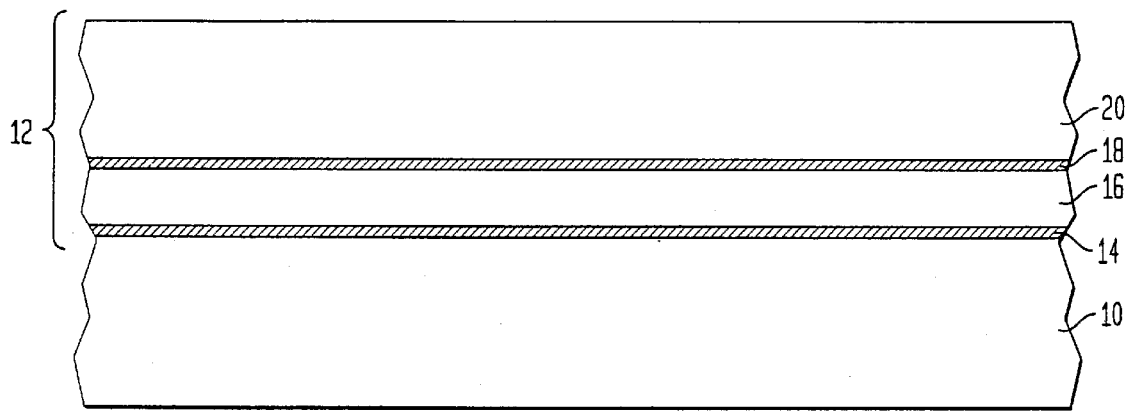
FIGS. 1A–1I are cross-sectional views showing the various processing steps of the present invention used in forming a non-volatile floating gate memory cell having a ONO capacitor merged with a self-aligned polysilicon strap.

The present invention which provides a method of fabricating a split gate non-volatile memory cell by integrating an ONO capacitor merged with a self-aligned polysilicon strap to a diffusion region will now be described in greater detail by referring to the drawings that accompany the present application. It should be noted that in the accompanying drawings like reference numerals are used for describing like and/or corresponding elements.

Reference is made to FIGS. 1A–1I which illustrate cross-sectional views of a non-volatile memory cell of the present invention during the various processing steps employed in the present invention. Specifically, FIG. 1A comprises an initial structure that is employed in the present invention. As shown, the initial structure comprises substrate 10 and a film stack 12 formed on a surface of the substrate. Film stack 12 includes a floating gate oxide layer 14 formed on the surface of substrate 10, a floating gate polysilicon layer 16 formed on said floating gate oxide layer, an oxide layer 18 formed on said floating gate polysilicon layer, and a nitride layer 20 formed on oxide layer 18.

The initial structure shown in FIG. 1A is composed of conventional materials well known in the art and it is formed utilizing techniques that are also well known in the art. A brief description of the methods and materials used in forming the structure shown in FIG. 1A will now be provided.

Substrate 10 may be composed of any conventional semiconducting material including, but not limited to: Si, Ge, SiGe, GaAs, InAs, InP and all other III/V semiconductor compounds. The substrate may also be composed of a layered semiconductor such as Si/SiGe. The substrate may be of the n-type or the p-type depending on the type of device to be fabricated. The substrate may optional include various active and/or isolation regions either formed on the surface of the substrate or formed within the substrate prior to forming the film stack thereon.

Floating gate oxide layer 14 of film stack 12 is formed on the surface of substrate 10 using a conventional thermal growing process, or alternatively, the oxide layer may be formed by a conventional deposition process such as, but not limited to: chemical vapor deposition (CVD), plasma-assisted CVD, sputtering, evaporation and other like deposition processes. The thickness of floating gate oxide layer 14 may vary, but the oxide layer typically has a thickness of from about 6 to about 15 nm, with a thickness of from about 8 to about 10 nm being more highly preferred. Any oxide-containing material such as $SiO_2$ can be employed as floating gate oxide layer 14.

Insofar as floating gate polysilicon layer 16 is concerned, that layer is formed on the floating gate oxide layer utilizing a conventional deposition process such as CVD, plasma-assisted CVD and sputtering. The thickness of floating gate polysilicon layer 16 may vary, but the polysilicon layer typically has a thickness of from about 10 to about 500 nm, with a thickness of from about 60 to about 80 nm being more highly preferred.

Oxide layer 18 of film stack 12 is formed utilizing any of the techniques mentioned above in connection with floating gate oxide layer 14 and the thickness of oxide layer 18 is typically of from about 6 to about 12 nm, with a thickness of from about 8 to about 10 nm being more highly preferred.

The nitride layer of the film stack, i.e., nitride layer 20, is formed over oxide layer 18 by utilizing a conventional deposition process well known to those skilled in the art that is capable of forming a nitride layer. Illustrative examples of typically deposition processes that are employed in forming nitride layer 20 include, but are not limited to: CVD, plasma-assisted CVD, sputtering, evaporation and other like deposition processes. The thickness of nitride layer 20 may vary, but it typically has a thickness of from about 250 to about 450 nm, with a thickness of from about 300 to about 350 nm being more highly preferred. Any material capable of forming a nitride layer such as $Si_3N_4$ may be employed in the present invention.

Figure 1B:
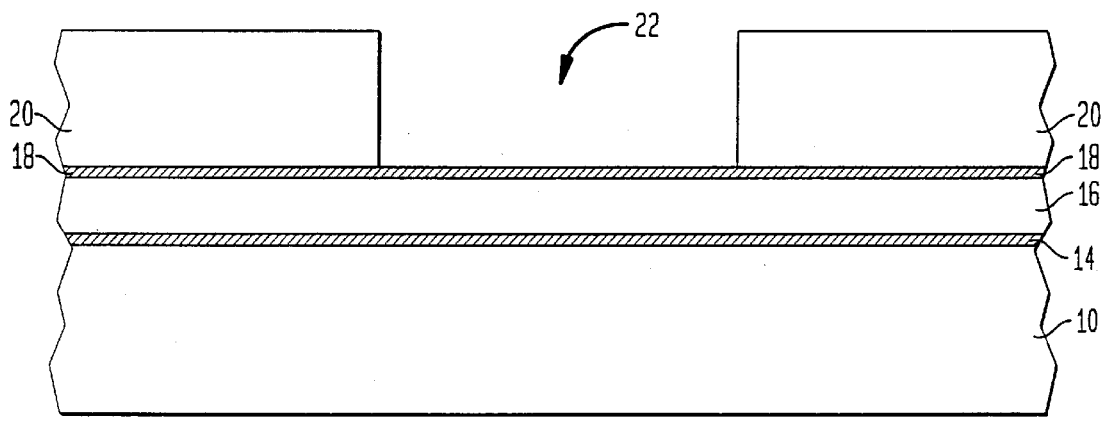

Next, as shown in FIG. 1B, opening 22 is formed in the film stack so as to expose a portion of floating gate polysilicon 16. It is noted that although only one opening is shown in the drawings of the present invention, the present invention works equal well in forming a plurality of openings in the film stack. Specifically, a photoresist, not shown in the drawings, is formed on the exposed surface layer of nitride layer 20 utilizing a conventional deposition process. The photoresist layer is then patterned utilizing conventional lithography so as to expose selective regions of the film stack in which an opening is to be formed. The lithography step employed in the present invention includes exposing the photoresist to radiation to form a pattern in the photoresist and developing the pattern. Since such steps are well known to those skilled in the art, a detailed description of the same is not needed herein.

The opening is then formed by etching the exposed region of the nitride layer and the oxide layer of the film stack utilizing a conventional dry etching process such as RIE, ion-beam etching, plasma etching or any other like dry etch process. A combination of the aforementioned dry etch processes may also be used in providing the opening to the floating gate polysilicon layer. Following trench etch, the patterned photoresist is removed by a conventional stripping process providing the structure illustrated in FIG. 1B.

Figure 1C:
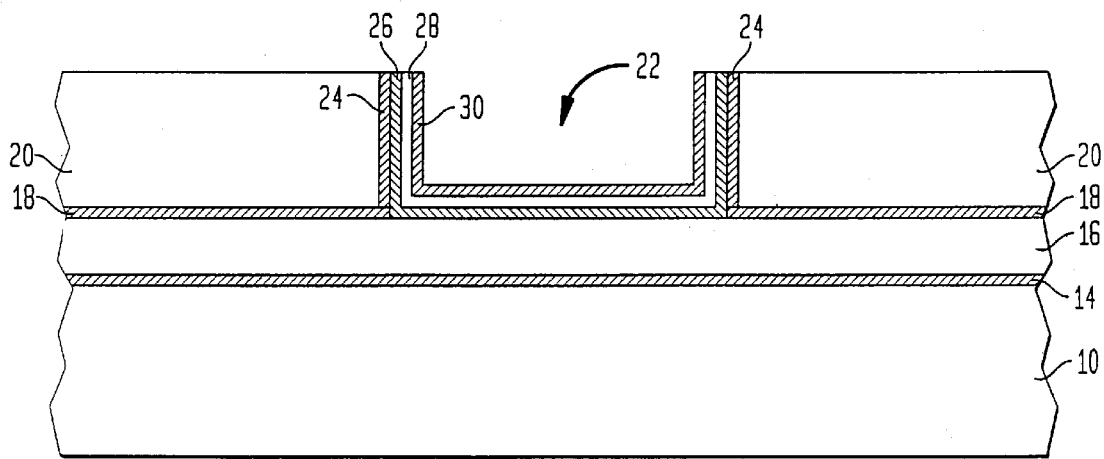

The next two processing steps of the present invention, i.e., forming oxide spacers in said opening and forming an oxide-nitride-oxide (ONO) capacitor in said opening, are shown in FIG. 1C. Specifically, after providing the opening in the structure so as to expose a portion of the floating gate polysilicon, thin (50 nm or less) oxide spacers 24 are formed on the exposed sidewalls in the opening. Oxide spacers 24 are formed utilizing conventional processes well known in the art. For example, the oxide spacers may be formed by depositing a thin oxide layer on the exposed sidewalls of the opening and then etching the thin oxide layer to form the oxide spacers. The deposition process employed in forming the thin oxide layer includes any conventional deposition process such as CVD and plasma-assisted CVD and etching may be preformed by a conventional dry etching process such as RIE.

Following oxide spacers formation an ONO capacitor is formed in the opening. The ONO capacitor (See FIG. 1C) includes bottom oxide layer 26, nitride layer 28, and top oxide layer 30. The bottom and top oxide layers may be formed utilizing the same or different processing techniques, i.e., thermal growing or deposition, as used previously in forming the floating gate oxide layer. In the case of the top oxide layer only, that oxide layer may be formed by oxidizing a portion of the nitride layer. Regarding the nitride layer of the capacitor, that layer is formed utilizing the same or different deposition process as was previously used in forming nitride layer 20 of film stack 12.

The thickness of the bottom oxide layer of the capacitor is typically of from about 5 to about 15 nm, with a thickness of from about 6 to about 8 nm being more highly preferred. Insofar as the top oxide layer of the ONO capacitor is concerned, the top oxide layer typically has a thickness of from about 1 to about 10 nm, with a thickness of from about 6 to about 8 nm being more highly preferred. The nitride layer of the capacitor typically has a thickness of from about 4 to about 10 nm, with a thickness of from about 6 to about 8 nm being more highly preferred.

Figure 1D:
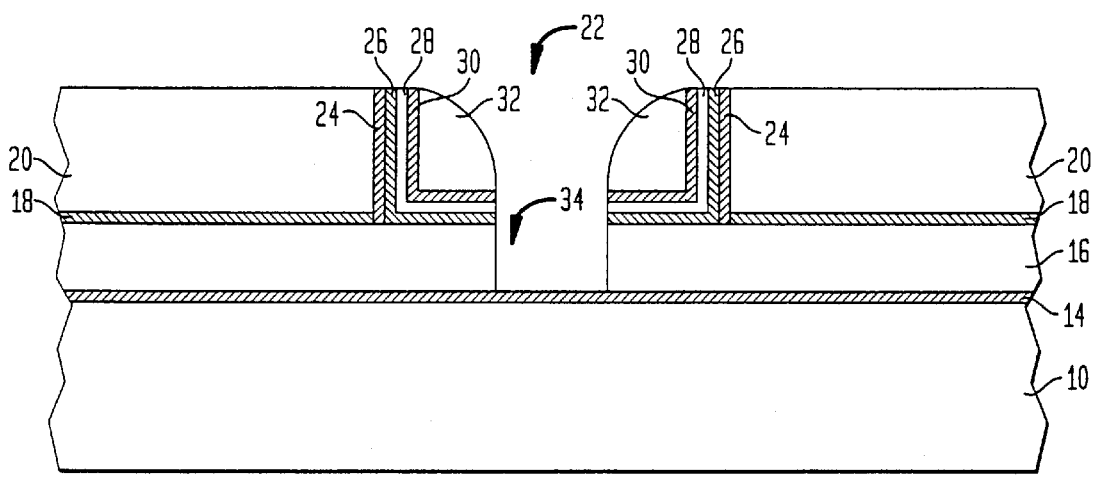

The next few processing steps of the present invention are shown in FIG. 1D. Specifically, FIG. 1D shows a structure that is formed after forming polysilicon spacers on said oxide-nitride-oxide capacitor and providing a contact hole in said opening so as to expose a portion of said substrate.

After forming the ONO capacitor in the opening, polysilicon spacers 32 are formed over the top oxide layer, i.e., oxide layer 30, of the ONO capacitor utilizing a conventional deposition process and etching. As is shown in FIG. 1D, polysilicon spacers are formed over the sidewalls of the ONO capacitor as well as a portion of the ONO capacitor on the bottom of the opening; a portion of the ONO capacitor on the bottom portion of the opening remains exposed.

Following polysilicon spacer formation, contact hole 34 is formed through the exposed portions of ONO capacitor, floating gate polysilicon layer 16, and floating gate oxide layer 14 so as to expose a portion of substrate 10. Contact hole 34 is formed utilizing any technique or combination thereof that is capable of removing the various layers mentioned above. For example, the contact hole may be formed utilizing a dry etch process, a chemical wet etch process or any combination thereof. One preferred technique that is employed in the present invention in forming the contact hole is by first etching the oxide-nitride-oxide layers of the capacitor by flourine-based etchants, then removing the floating gate polysilicon layer by chlorine-based etchants and thereafter removing the floating gate oxide layer by flourine-based etchants.

Figure 1E:
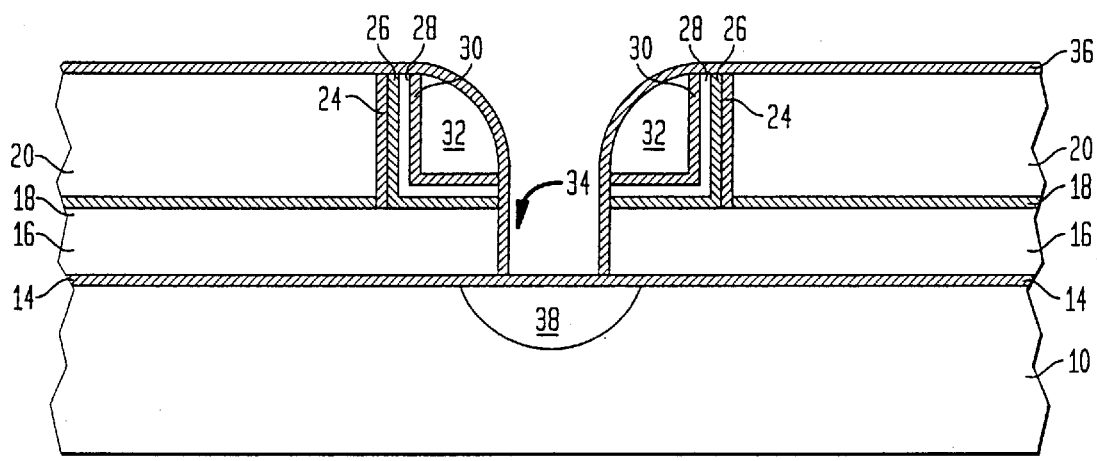
Figure 1F:
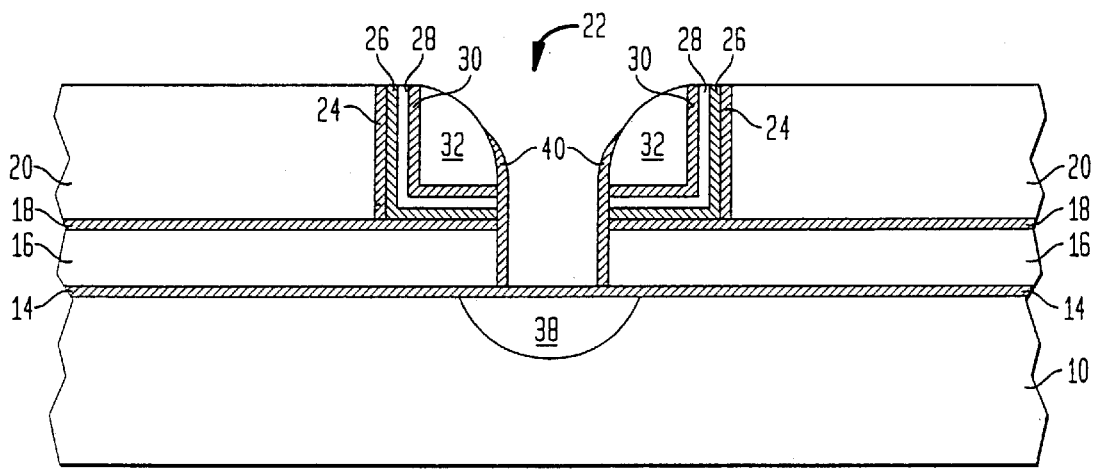

The next two processing steps of the method of the present invention are shown in FIGS. 1E and 1F.

Specifically, FIG. 1E shows a structure after forming an oxide liner 36 in the bottom region of the contact hole and then forming source region 38 in the substrate. As shown, oxide liner 36 is formed in the opening including the contact hole as well as the surface of nitride layer 20.

Oxide liner 36 is formed utilizing a conventional conformal deposition process such as CVD. The thickness of the oxide liner employed in the present invention is typically of from about 15 to about 35 nm, with a thickness of from about 20 to about 25 nm being more highly preferred.

Source region 38 is formed by conventional ion implantation and activation annealing. Since such processing steps are well known to those skilled in the art, a detailed description of the same is not provided herein.

Following the formation of the source region, an optional oxide liner may be formed over the previous formed oxide liner. This optional embodiment of the present invention is not shown in the drawings of the present invention.

Next, as shown in FIG. 1F, oxide spacers 40 are formed from said oxide liner 36, wherein during the forming step a portion of said substrate is re-expose. Oxide spacers are formed by etching the previous formed oxide layer(s) utilizing a conventional etch process such as RIE.

Figure 1G:
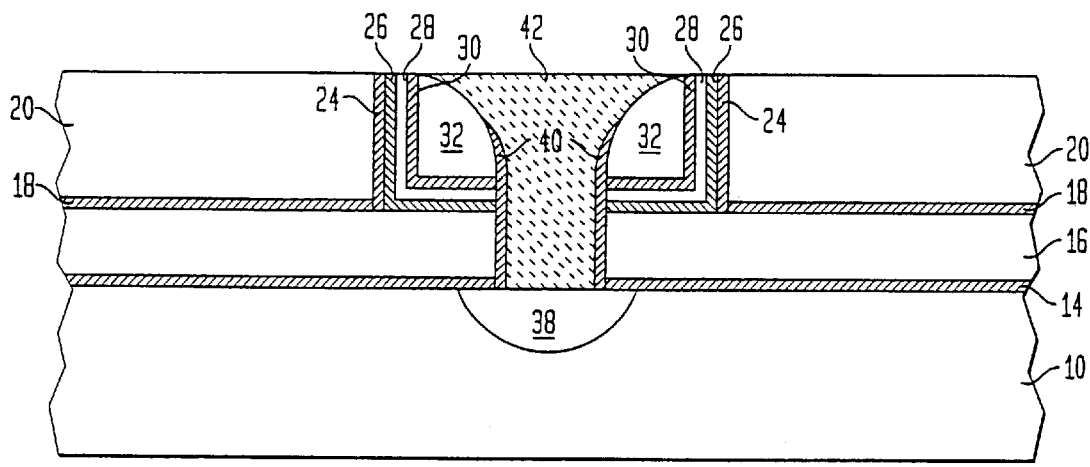

FIG. 1G shows the structure after polysilicon fill and planarization. Specifically, after forming the oxide spacers in the contact hole, the contact hole as well as the opening are filled with doped polysilicon 42. Doped polysilicon region 42 may be formed by first depositing polysilicon and then doping the polysilicon with an appropriate doping atom by ion implantation and annealing, or alternatively, doped polysilicon region 42 is formed utilizing a conventional in-situ doping deposition process. Planarization is achieved in the present invention by utilizing any conventional planarizing process such as chemical-mechanical polishing (CMP) or grinding.

It is noted that the non-volatile memory cell structure shown in FIG. 1G includes ONO capacitor (oxide layer 26, nitride layer 28, oxide layer 30) merged with polysilicon strap region 42. These two regions, i.e., ONO capacitor and the polysilicon strap, are integrated to source region 38. It is also noted that source region 38 is a diffusion region that is self-aligned with the floating gate region of the device and extends under the floating gate into the floating gate channel region.

Figure 1H:
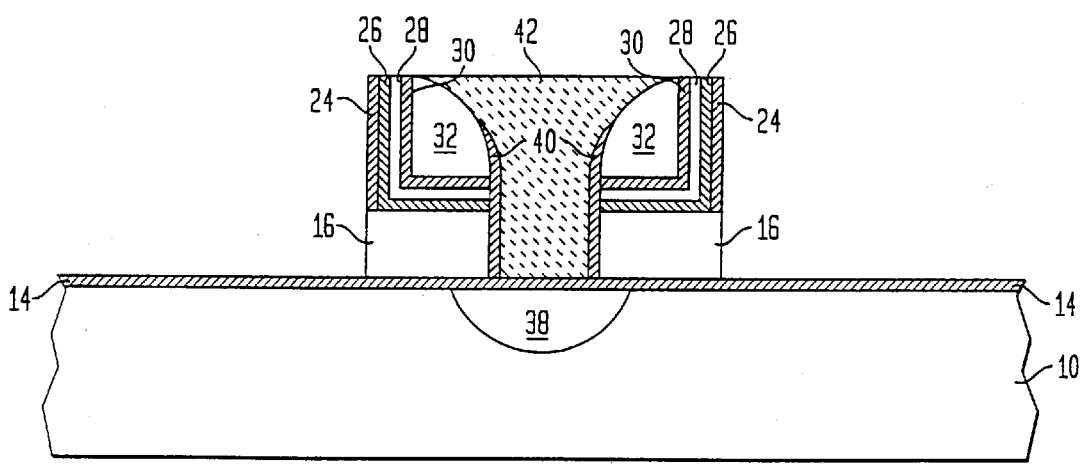
Figure 1I:
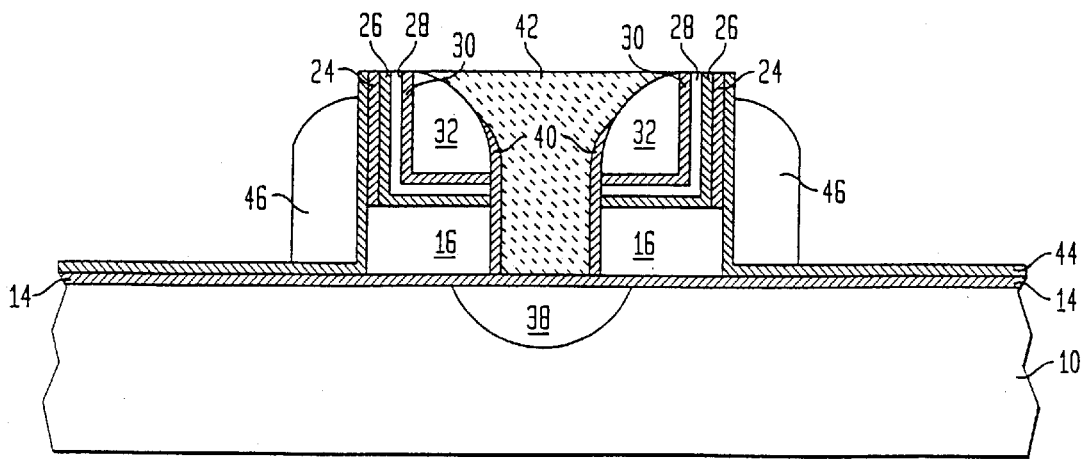

The non-volatile memory device is then completed by using conventional processing techniques which may include: removing a portion of nitride layer 20 and floating gate polysilicon layer 16 of said film stack (in this step, oxide layer 18 is completely removed); forming a wordline gate oxide 44; and forming a wordline spacer 46 about said wordline gate oxide. The structures formed by these various processing steps are shown in FIGS. 1H and 1I.

The nitride layer and the polysilicon layer are removed utilizing a conventional damascene etch back processing step wherein a chemical etchant such as buffered HF is employed. The wordline gate oxide is formed utilizing a conventional deposition process (or by thermal growing) and wordline spacers are formed by a conventional deposition process and etching.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described my invention in detail, what I claim is new, and desire to secure by the Letters Patent is:

1. A method of forming a non-volatile memory cell having an oxide-nitride-oxide (ONO) capacitor merged with a polysilicon strap comprising the steps of:
   (a) forming a film stack on a surface of a substrate, said film stack comprising at least a floating gate oxide layer, a floating gate polysilicon layer, an oxide layer and a nitride layer;
   (b.) forming an opening in said film stack so as to expose a portion of said floating gate polysilicon layer;
   (c) forming oxide spacers in said opening;
   (d) forming an oxide-nitride-oxide capacitor in said opening;
   (e) forming polysilicon spacers on said oxide-nitride-oxide capacitor;
   (f) providing a contact hole in said opening so as to expose a portion of said substrate;
   (g) forming an oxide liner in said contact hole and on said nitride layer of said film stack;
   (h) forming a source region in said substrate;
   (i) forming oxide spacers from said oxide liner;
   (j) filling said opening and contact hole with doped polysilicon; and
   (k) planarizing down to said nitride layer of said film stack.

2. The method of claim 1 further comprising:
   (l) removing the nitride layer and said floating gate polysilicon layer of said film stack;
   (m) forming a wordline gate oxide; and
   (n) forming a wordline spacer about said wordline gate oxide.

3. The method of claim 1 wherein said floating gate oxide layer is formed by thermal growing or by a deposition process selected from the group consisting of chemical vapor deposition (CVD), plasma-assisted CVD, sputtering and evaporation.

4. The method of claim 1 wherein said floating gate oxide layer has a thickness of from about 6 to about 15 nm.

5. The method of claim 4 wherein said floating gate oxide layer has a thickness of from about 8 to about 10 nm.

6. The method of claim 1 wherein said floating gate polysilicon layer is formed by a deposition process selected from the group consisting of CVD, plasma-assisted CVD and sputtering.

7. The method of claim 1 wherein said floating gate polysilicon layer has a thickness of from about 10 to about 500 nm.

8. The method of claim 7 wherein said floating gate polysilicon layer has a thickness of from about 60 to about 80 nm.

9. The method of claim 1 wherein said opening is formed by lithography and etching.

10. The method of claim 9 wherein said lithography step includes forming a photoresist on said film stack, exposing said photoresist to radiation so as to form a pattern in said photoresist and developing the patterned photoresist.

11. The method of claim 9 wherein said ethcing includes reactive-ion etching (RIE), ion-beam etching or plasma etching.

12. The method of claim 1 wherein step (c) includes forming an oxide layer and etching the oxide layer.

13. The method of claim 1 wherein said oxide-nitride-oxide capacitor is formed by depositing layers of oxide, nitride and oxide using the same or different deposition process selected from the group consisting of CVD, plasma-assisted CVD, sputtering and evaporation.

14. The method of claim 1 wherein said oxide layers of said oxide-nitride-oxide capacitor are formed thermally.

15. The method of claim 1 wherein said polysilicon spacers are formed by depositing a layer of polysilicon and etching said layer of polysilicon.

16. The method of claim 1 wherein said contact hole is provided by dry etching, chemical etching or any combination thereof.

17. The method of claim 1 wherein said oxide liner is formed thermally or by a deposition process selected from the group consisting of CVD, plasma-assisted CVD, sputtering and evaporation.

18. The method of claim 1 wherein said source region is formed by ion implantation and activation annealing.

19. The method of claim 1 wherein step (j) includes depositing polysilicon and then doping or by an in-situ doping deposition process.

20. The method of claim 1 wherein step (k) includes chemical-mechanical polishing or grinding.

* * * * *